United States Patent [19]
Horita

[11] Patent Number: 5,905,669
[45] Date of Patent: May 18, 1999

[54] HIERARCHICAL ROUTING METHOD TO BE IMPLEMENTED IN A LAYOUT SYSTEM FOR A SEMICONDUCTOR INTEGRATED CIRCUIT AND MEDIUM ON WHICH THE HIERARCHICAL ROUTING PROGRAM IS STORED

[75] Inventor: Keisuke Horita, Kawasaki, Japan

[73] Assignee: Fujitsu Limited, Kawasaki, Japan

[21] Appl. No.: 08/940,005

[22] Filed: Sep. 29, 1997

[30] Foreign Application Priority Data

May 19, 1997 [JP] Japan ................................. 9-128747

[51] Int. Cl.⁶ ....................................................... G11C 5/02
[52] U.S. Cl. ............................................. 365/51; 364/491
[58] Field of Search ............................... 365/51; 364/491, 364/488, 489, 490

[56] References Cited

U.S. PATENT DOCUMENTS 5,493,510   2/1996   Shikata ..................................... 364/491
5,745,374   4/1998   Matsumoto .............................. 364/491

*Primary Examiner*—David Nelms
*Assistant Examiner*—David Lam
*Attorney, Agent, or Firm*—Staas & Halsey

[57] ABSTRACT

A hierarchical routing method is implemented in a layout system for a semiconductor integrated circuit which has a repetitive circuit portion. The hierarchical routing method lays out circuit elements for the repetitive circuit portion with the repetitive circuit portion structured hierarchically, expands the layout for the hierarchically-structured repetitive circuit portion in a separate independent database, extracts information of connections from the expanded layout for the repetitive circuit portion, and then carries out routing. Therefore, a semiconductor integrated circuit having a repetitive circuit portion can be designed in a short period of time while excellent properties are ensured for the semiconductor integrated circuit.

12 Claims, 8 Drawing Sheets

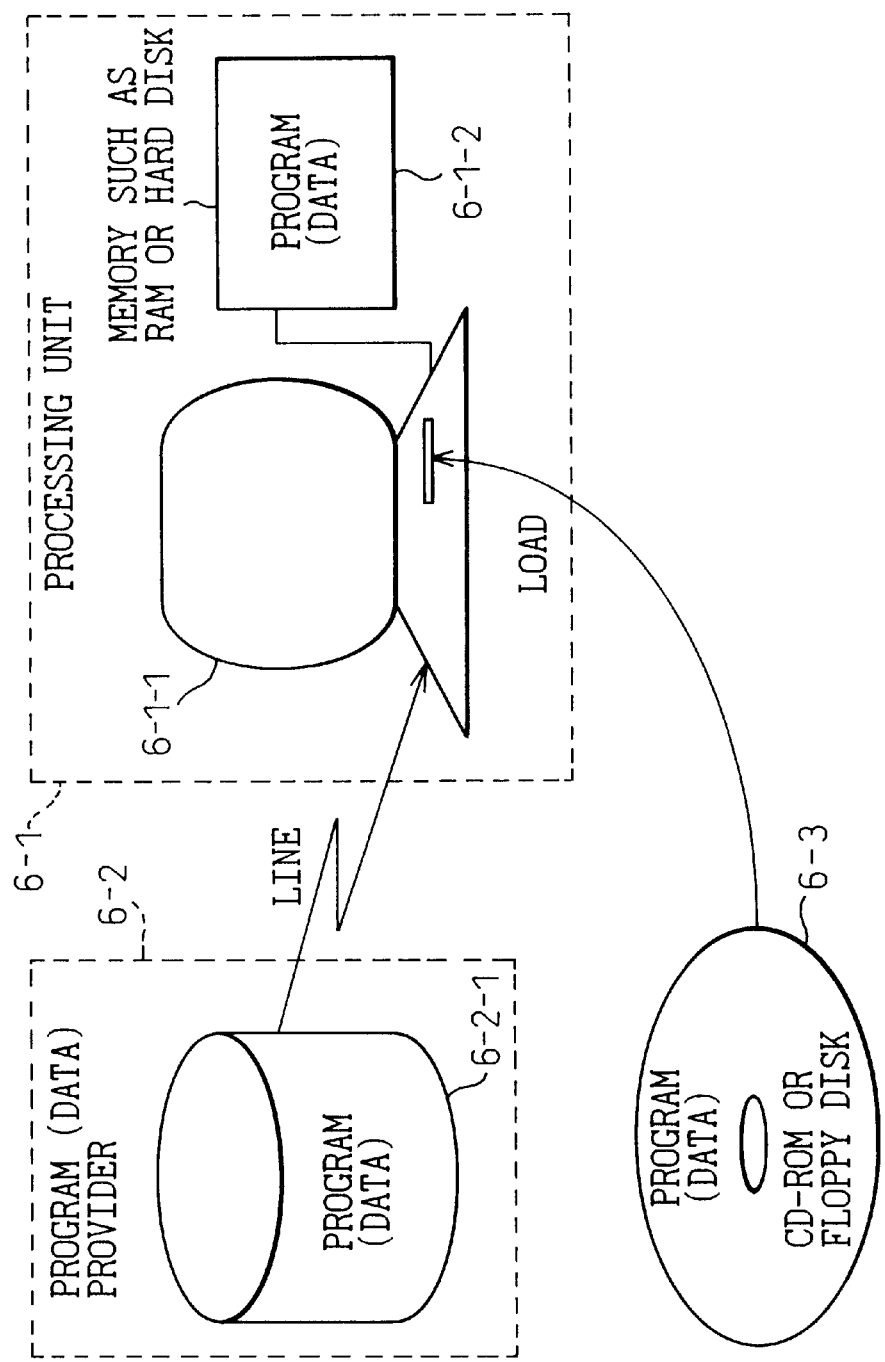

HIERARCHICAL ROUTING METHOD TO BE IMPLEMENTED IN A LAYOUT SYSTEM FOR A SEMICONDUCTOR INTEGRATED CIRCUIT AND MEDIUM ON WHICH THE HIERARCHICAL ROUTING PROGRAM IS STORED

BACKGROUND OF THE INVENTION

1. Field of the Invention

The present invention relates to a hierarchical routing method and a medium on which the hierarchical routing program is stored, and more particularly, to a hierarchical routing method to be implemented in a layout system for a semiconductor integrated circuit having a repetitive circuit portion.

2. Description of the Related Art

Recently, digital signal processors (DSPs) have been utilized for multiple purposes in systems for performing radio and other communications or handling moving pictures. In the DSP, when realizing a semiconductor integrated circuit, approximately 90% of the internal configuration is a repetitive circuit referred to as a data path. When a computer uses multimedia, it is desirable to design a high-performance data path within a short period of time.

In the past, there have been two methods of laying out circuit elements for constructing a repetitive circuit portion (data path) of a DSP, arithmetic logic unit (ALU), multiplier (tree circuit) or the like; that is, a method of laying them out completely manually and a method using a completely automated placement/routing system (automatic routing system).

Concretely, for example, when emphasis is put on properties, a repetitive circuit portion is designed by repeatedly placing a unit of layout that is the smallest wiring produced manually (a unit circuit that is a cell). However, the wiring in the repetitive circuit portion includes not only a regular repetition pattern but also many irregular patterns.

In order to produce the whole wiring manually, many man-hours are required. Moreover, an operator producing the wiring often makes mistakes. This causes a prolonged (delayed) design process.

Incidentally, an automatic placement/routing system is used to design a random circuit (random logic) originally devoid of regularity. A system for placing a cell (unit circuit) used to construct the same circuit at the same relative position for the purpose of designing a repetitive circuit portion has been proposed in the past.

However, the automatic placement/routing system carries out routing independently according to a maze routing method or the like. In a cell used to construct each repetitive circuit portion, circuit elements are laid out so that a total length of a resultant wiring becomes the shortest. This poses a problem that the length of a wiring becomes different among the cells constituting a repetitive circuit portion.

A design tool dedicated to a data path (repetitive circuit portion) has been developed by producing an automatic placement/routing tool dedicated to random circuits. The tool merely gives control so as to place a unit circuit (cell) used to construct a repetitive circuit portion at the same relative position. An algorithm devised for producing a random circuit is used for routing. It is therefore not guaranteed that the wiring load is the same among the cells constituting a repetitive circuit portion.

The properties of a repetitive circuit portion produced using the design tool are inferior to those of a repetitive circuit portion produced manually by laying out circuit elements thereof with the repetitive circuit portion structured hierarchically. There is therefore an increasing demand for a hierarchical routing method to be implemented in a layout system for a semiconductor integrated circuit according to which the merit of short-term design automatic layout can be exploited while properties that are almost as good as those ensured by manual layout are maintained.

The prior art hierarchical routing method to be implemented in a layout system for a semiconductor integrated circuit and problems associated with the prior art hierarchical routing method will be described in detail later with reference to the drawings.

SUMMARY OF THE INVENTION

An object of the present invention is to provide a hierarchical routing method to be implemented in a layout system for a semiconductor integrated circuit according to which a semiconductor integrated circuit having a repetitive circuit portion can be designed in a short period of time while excellent properties are ensured for the semiconductor integrated circuit.

According to the present invention, there is provided a hierarchical routing method, to be implemented in a layout system for a semiconductor integrated circuit having a repetitive circuit portion, comprising the steps of laying out circuit elements for the repetitive circuit portion by hierarchically structuring the repetitive circuit portion; expanding (exploding or flattening) the layout hierarchically structured for the repetitive circuit portion in a separate independent database; and extracting information of connections from the expanded layout for the repetitive circuit portion so as to carry out routing.

A layout net list and a logic net list concerning the expanded layout for the repetitive circuit portion may be collated with each other, and an unconnected net list containing data that may not reside in the layout net list is produced. The produced unconnected net list may be used to carry out automatic routing.

Version management may be carried out in order to keep a hierarchy database and an expanded database mutually consistent, the hierarchy database representing a hierarchical structure of the repetitive circuit portion, the expanded database being an expansion of the hierarchy database. The layout of circuit elements for a unit of repetition used to construct the repetitive circuit portion may be carried out by automatic routing.

According to the present invention, there is also provided a hierarchical routing method to be implemented in a layout system for a semiconductor integrated circuit having a repetitive circuit portion, comprising the steps of manually or automatically laying out circuit elements for a cell that is a unit of repetition used to construct the repetitive circuit portion; producing a hierarchy database by manually placing the cell repeatedly; producing an expanded database by expanding the hierarchy database in another database; comparing a layout net list produced by using the expanded database with a logic net list; identifying initial data that is data commonly contained in the layout net list and the logic net list; producing an unconnected net list by extracting data, which is not contained in the layout net list, from the logic net list, and carrying out automatic routing using the unconnected net list so as to produce unconnected wiring data; and producing final layout data using the initial data and unconnected wiring data.

Version management may be carried out in order to keep the hierarchy database and the expanded database mutually consistent.

Further, according to the present invention, there is provided a medium on which a hierarchical routing program to be run on a computer system is stored in order to implement a hierarchical routing method to be implemented in a layout system for a semiconductor integrated circuit having a repetitive circuit portion, wherein the hierarchical routing method comprises the steps of laying out circuit elements for the repetitive circuit portion by hierarchically structuring the repetitive circuit portion; expanding the layout hierarchically structured for the repetitive circuit portion in a separate independent database; and extracting information of connections from the expanded layout for the repetitive circuit portion so as to carry out routing.

In addition, according to the present invention, there is also provided a medium on which a hierarchical routing program to be run on a computer system is stored in order to implement a hierarchical routing method to be implemented in a layout system for a semiconductor integrated circuit having a repetitive circuit portion, wherein the hierarchical routing method comprises the steps of manually or automatically laying out circuit elements for a cell that is a unit of repetition used to construct the repetitive circuit portion; producing a hierarchy database by manually placing the cell repeatedly; producing a expanded database by expanding the hierarchy database in another database; comparing a layout net list produced by using the expanded database with a logic net list; identifying initial data that is data commonly contained in the layout net list and the logic net list; producing an unconnected net list by extracting data, which is not contained in the layout net list, from the logic net list, and carrying out automatic routing using the unconnected net list so as to produce unconnected wiring data; and producing final layout data using the initial data and unconnected wiring data.

BRIEF DESCRIPTION OF THE DRAWINGS

The present invention will be more clearly understood from the description of the preferred embodiments as set forth below with reference to the accompanying drawings, wherein:

FIG. 6 is a diagram showing a model of a practical example of a medium in accordance with the present invention on which a hierarchical routing program to be installed in a layout system for a semiconductor integrated circuit is recorded.

DESCRIPTION OF THE PREFERRED EMBODIMENTS

First, a conventional automatic routing method and problems in the conventional method will be explained with reference to FIGS. 1A to 1C prior to description of a hierarchical routing method to be implemented in a layout system for a semiconductor integrated circuit in accordance with the present invention.

Figure 1A:
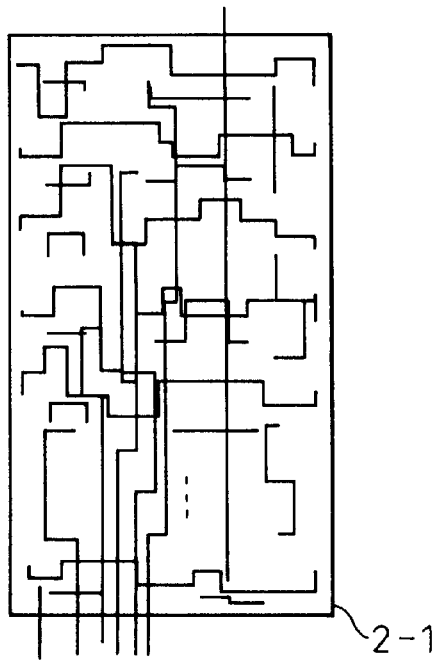
FIGS. 1A, 1B, and 1C are diagrams for explaining a conventional automatic routing method to be implemented in an example of a layout system for a semiconductor integrated circuit.
Figure 1B:
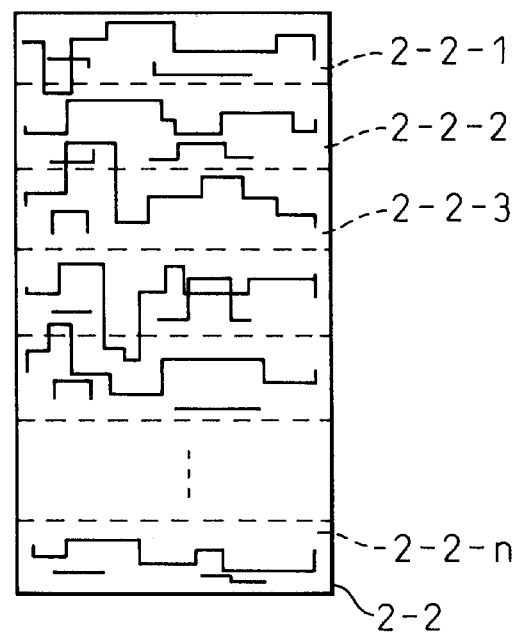
Figure 1C:
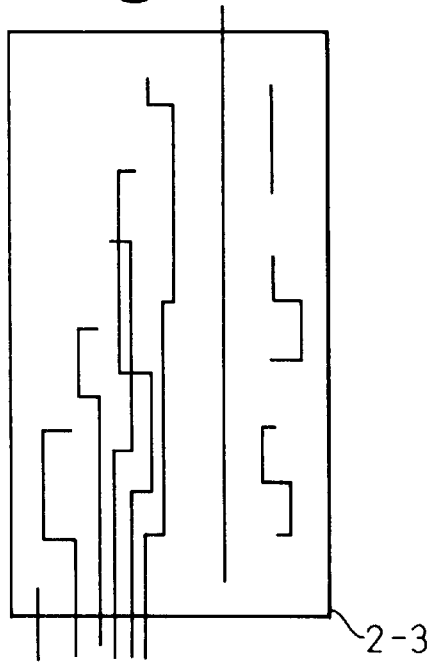

FIGS. 1A, 1B, and 1C show a conventional automatic routing method to be implemented in an example of a layout system for a semiconductor integrated circuit. FIG. 1A shows a whole wiring (wiring pattern) 2-1, FIG. 1B shows a wiring 2-2 in a repetitive circuit portion, and FIG. 1C shows a wiring 2-3 in a random circuit portion.

Assuming that a conventional layout system for a semiconductor integrated circuit is used to carry out automatic routing so as to produce wiring for a semiconductor integrated circuit having a repetitive circuit portion (data path); such as, a DSP or ALU, or a tree circuit of a multiplier, a layout (wiring pattern) 2-1 shown in FIG. 1A is produced. The overall wiring pattern 2-1 shown in FIG. 1A is composed of the wiring 2-2 for a repetitive circuit portion produced by repeatedly placing a cell as shown in FIG. 1B, and the wiring 2-3 consisting of signal lines for a clock and control signals or designed for a random circuit portion devoid of regularity shown in FIG. 1C.

As shown in FIG. 1C, the wiring 2-3 for a random circuit portion (clock path or the like) is a proper layout of circuit elements in which shortest routes are selected by an automatic routing system. However, as shown in FIG. 1B (See FIG. 2B for comparison), when the automatic routing system is used to produce the wiring 2-2 for a repetitive circuit portion such as a data path in which one unit circuit is placed repeatedly regularly (cells 2-2-1 to 2-2-n), a wiring is produced by independently selecting routes making the length of the wiring smallest according to a maze routing method or the like with no consideration taken into the cells 2-2-1 to 2-2-n constituting the repetitive circuit portion. The length of a wiring is therefore different among the cells 2-2-1, 2-2-2, 2-2-3, etc., and 2-2-n constituting the repetitive circuit portion.

As mentioned above, when the conventional routing system for a semiconductor integrated circuit is used to carry out automatic routing so as to produce a wiring for a semiconductor integrated circuit having a repetitive circuit portion, as shown in FIG. 1B, the lengths of wires in the cells 2-2-1, 2-2-2, 2-2-3, etc., and 2-2-n constituting the repetitive circuit portion become mutually different. When the length of wiring is different among the cells 2-2-1 to 2-2-n, the symmetry of the repetitive circuit portion (data path) 2-2 that should be a regular circuit is impaired. A wiring load or a delay of a signal becomes different from cell to cell. The operations of the repetitive circuit portion cannot be guaranteed until all wiring loads are detected and operation timing is verified. As a result, according to the prior art, routing must be resumed several times until the required operation timing is attained. For a semiconductor integrated circuit having a complex repetitive wiring, such as a tree circuit of a multiplier, it is hard to connect all the wiring.

Furthermore, for making the wiring in the cells 2-2-1 to 2-2-n constituting the repetitive circuit portion 2-2 consistent with one another, it is conceivable to produce a repetitive layout by utilizing a hierarchical structure. In a graphic used for routing and showing hierarchically-structured cells constituting a repetitive circuit portion, a plurality of nodes appear on an upper-level hierarchical layer. This poses a problem that an automatic routing tool that assigns net information to symbols used for routing cannot deal with hierarchically-structured wiring.

A hierarchical routing method to be implemented in a layout system for a semiconductor integrated circuit in accordance with the present invention will be described with reference to the drawings.

Figure 2A:
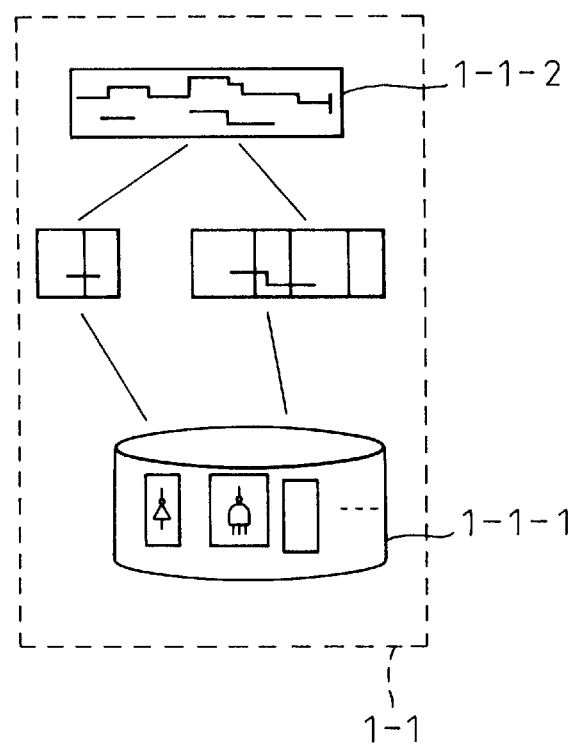
FIGS. 2A, 2B, 2C, and 2D are diagrams for explaining the principles of a hierarchical routing method to be implemented in a layout system for a semiconductor integrated circuit in accordance with the present invention.
Figure 2B:
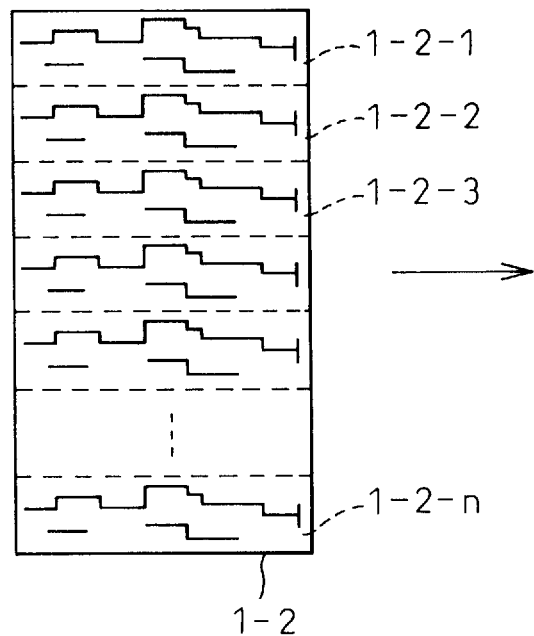
Figure 2C:
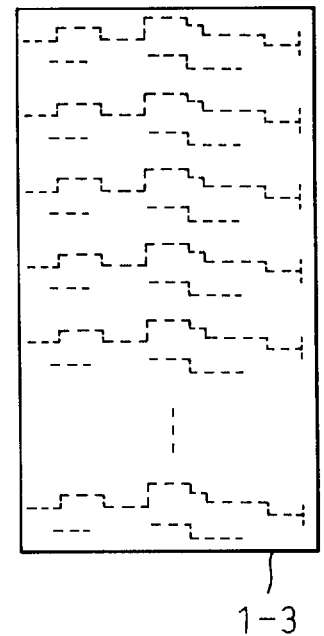
Figure 2D:
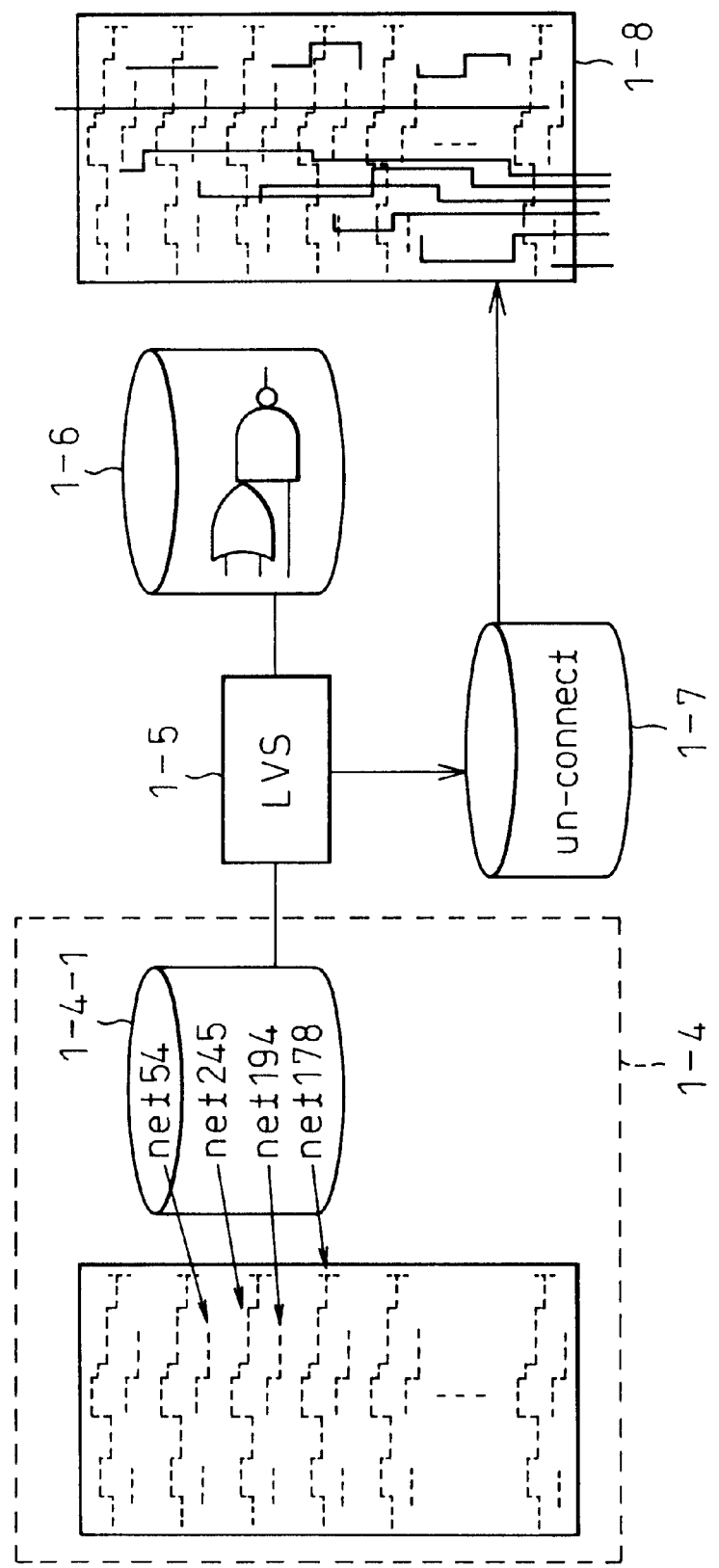

FIGS. 2A to 2D are diagrams for explaining the principles of a hierarchical routing method to be implemented in a layout system for a semiconductor integrated circuit in accordance with the present invention. FIG. 2A shows a layout 1-1 of circuit elements constituting each cell (unit circuit) 1-1-2 (1-2-1 to 1-2-n) used to construct a repetitive circuit portion, FIG. 2B shows an overall structure 1-2 of the repetitive circuit portion (data path), and FIG. 2C shows a repetitive circuit portion 1-3 that is an expansion of the repetitive circuit portion 1-2 shown in FIG. 2A in a separate independent database. FIG. 2D shows a situation in which wiring is extracted in order to carry out automatic routing. As shown in FIG. 2C, the repetitive circuit portion is constructed by, for example, placing one cell (unit circuit for handling one bit) n times (n bits) in the form of an array.

Figure 3:
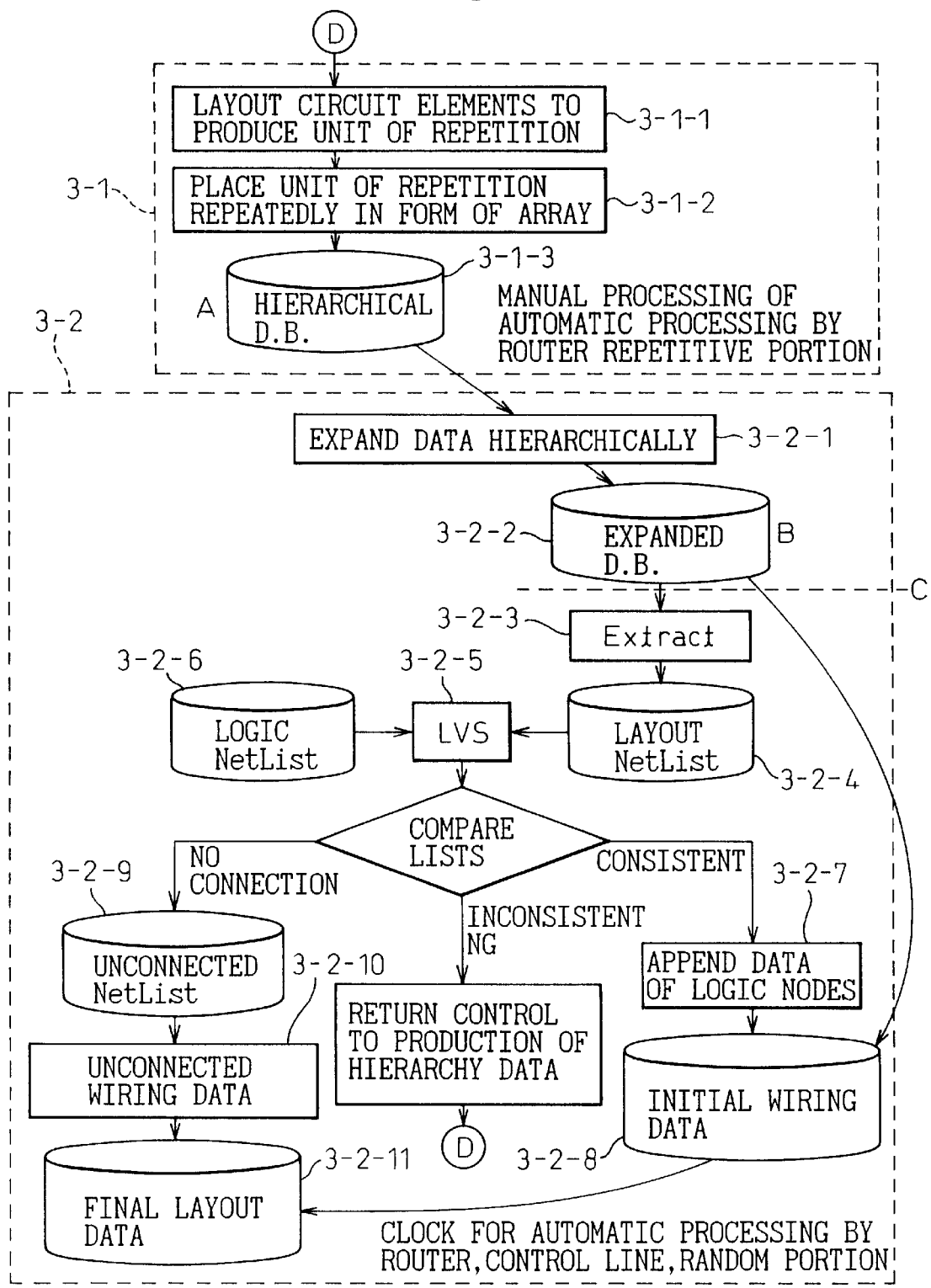
FIG. 3 is a flowchart for explaining an example of the hierarchical routing method to be implemented in a layout system for a semiconductor integrated circuit in accordance with the present invention.

FIG. 3 is a flowchart for explaining an example of the hierarchical routing method to be implemented in a layout system for a semiconductor integrated circuit in accordance with the present invention. In the hierarchical routing method to be implemented in a layout system for a semiconductor integrated circuit in accordance with the present invention, hierarchical layout is adopted in order to make the properties of the cells constituting the repetitive circuit portion (data path) consistent with one another. In FIG. 3, there is shown a hierarchical layout 3-1, to be carried out for the repetitive circuit portion, and an automatic layout 3-2.

Referring to the diagrams of FIGS. 2A to 2D for explaining the principles and the flowchart of FIG. 3, the hierarchical routing method to be implemented in a layout system for a semiconductor integrated circuit in accordance with the present invention will be described.

First, at step 3-1-1, circuit elements are laid out to produce a cell 1-1-2 (1-2-1 to 1-2-n) that is a unit of repetition used to construct the repetitive circuit portion as shown in FIG. 2A. Specifically, as shown in FIG. 2A, given data items are fetched from a library 1-1-1 containing data items of circuit elements, and then laid out to produce the cell (for example, a unit circuit for handling one bit) 1-1-2 used to construct the repetitive circuit portion. Both a manual method (manual processing by an operator) and automatic method can be adopted for laying out the circuit elements to produce the cell 1-1-2 used to construct the repetitive circuit portion.

Control is further passed to step 3-1-2. The cell 1-1-2 is placed repeatedly in the form of an array (for example, cells 1-1-1 to 1-1-n for handling n bits are arranged), whereby the repetitive circuit portion 1-2 (1-1-1 to 1-1-n) shown in FIG. 2B is constructed. Data of the repetitive circuit portion (hierarchy data) 1-2 composed of the plurality of cells 1-1-1 to 1-1-n is included in a hierarchy database (hierarchy DB) 3-1-3.

Control is then passed to step 3-2-1. The hierarchy data 1-2 included in the hierarchy database 3-1-3 is expanded (exploded or flattened) hierarchically, whereby data of the repetitive circuit portion (expanded data) 1-3 that is, as shown in FIG. 2C, a hierarchical expansion of the repetitive circuit portion is produced. The expanded data 1-3 is included in an expanded database (expansion DB) 3-2-2 shown in FIG. 3 which is different from the hierarchy database 3-1-3. At step 3-2-1, the hierarchy data 1-2 of the repetitive circuit portion shown in FIG. 2B which is included in the hierarchy database 3-1-3 is expanded hierarchically. This results in the wiring data shown in FIG. 2C (expanded data of the repetitive circuit portion 1-3). What is important is that a version management facility is appended to the hierarchy data 1-2 and expanded data 1-3 in order to make the hierarchy data and expanded data consistent with each other for processing. Version management will be described later.

Control is then passed to step 3-2-3. As shown in FIG. 2D, information on wiring and nodes is extracted and a layout net list 3-2-4 is output. Specifically, as shown in FIG. 2D, information on wiring and nodes (information concerning positions of circuit elements and connections of wiring) 1-4 is extracted from the layout data concerning the repetitive circuit portion which is expanded hierarchically as indicated with 1-4 in FIG. 2D. The layout net list 3-2-4 (denoted by reference numeral 1-4-1 in FIG. 2D) with net information added is then produced.

The layout net list 3-2-4 is compared with a logic net list 3-2-6 by a layout vs. scheme (LVS) unit 3-2-5. Specifically, if it is Judged from the result of the comparison performed by the LVS unit 3-2-5 (denoted by reference numeral 1-5 in FIG. 2D) that the layout net list 3-2-4 (1-4-1) and logic net list 3-2-6 (corresponding to 1-6 in FIG. 2D) are consistent with each other, control is passed to step 3-2-7. Node information concerning logic nodes is appended to the layout data. The resultant data is appended as initial wiring data 3-2-8 to final layout data 3-2-11. In other words, the layout net list 3-2-4 and logic net list 3-2-6 are consistent with each other when the hierarchically-expanded repetitive circuit portion 1-3 has wiring thereof connected correctly. In such case, the expanded data 1-3 (data with node information added 3-2-7) of the hierarchically-expanded repetitive circuit portion which is included in the expanded database 3-2-2 is added as the initial wiring data 3-2-8, which represents wiring and is provided by a router, in the final layout data 3-2-11.

Moreover, if it is judged from the result of the comparison performed by the LVS unit 3-2-5 that the layout net list 3-2-4 and logic net list 3-2-6 are inconsistent with each other, control is returned to a step of producing hierarchy data. That is to say, control is returned to step 3-1-1, and circuit elements are laid out to produce a cell (1-1-2) used to construct a repetitive circuit portion. Specifically, the situation in which the layout net list 3-2-4 and logic net list 3-2-6 are inconsistent with each other corresponds to a situation in which an operator fails to lay out circuit elements correctly for producing the cell (1-1-2) and a short circuit or the like therefore occurs in the wiring. For correcting this kind of error, control is returned again to step 3-1-1. Hierarchical layout 3-1 for the repetitive circuit portion is restarted.

Next, a version management facility working on the hierarchy data 1-2 to be included in the hierarchy database 3-1-3 and the expanded data 1-3 to be included in the expanded database 3-2-2 will be described. Herein, the hierarchy data (1-2) to be included in the hierarchy database 3-1-3 shall be called hierarchy data A, and the expanded data (1-3) to be included in the expanded database 3-2-2 shall be called expanded data B.

First, at step 3-2-1 of hierarchy expansion, if hierarchy data A and expanded data B are consistent with each other, that is, if A=B is established, a consistency flag is set. Thereafter, the LVS unit 3-2-5 compares the layout net list 3-2-4 with the logic net list 3-2-6. If, for example, they are inconsistent with each other because hierarchy data A has changed, A≠B is established. The processing described below dashed line C in FIG. 3, that is, the processing of step 3-2-3 and thereafter is suspended. Hierarchy data A is then hierarchically expanded at step 3-2-1. When expanded data B becomes consistent with hierarchy data A, that is, when A=B is established, the suspended processing described below dashed line C (the processing of step 3-2-3 and thereafter) is restarted. Thus, the processing proceeds with hierarchy data A and expanded data B held consistent with each other.

If it is judged from the result of the comparison performed by the LVS unit 3-2-5 that no connection has been made (denoted by reference numeral 1-7 in FIG. 2D), the layout net list 3-2-4 is used as an unconnected net list 3-2-9 to carry out automatic routing (denoted by 1-8 in FIG. 2D). This results in unconnected wiring data 3-2-10. In other words, the data of the logic net list 3-2-6 not contained in the layout net list 3-2-4 is used as data representing signal lines of a clock and control signals or the wiring of a random circuit. The unconnected net list 3-2-9 is thus produced. Processing similar to conventional automatic routing is carried out using the unconnected net list 3-2-9 (See FIG. 1C), whereby unconnected wiring data 3-2-10 is produced. The unconnected wiring data 3-2-10 is appended to the final layout data 3-2-11. Thus, layout for producing a semiconductor integrated circuit having a repetitive circuit portion is completed.

Figure 4A:
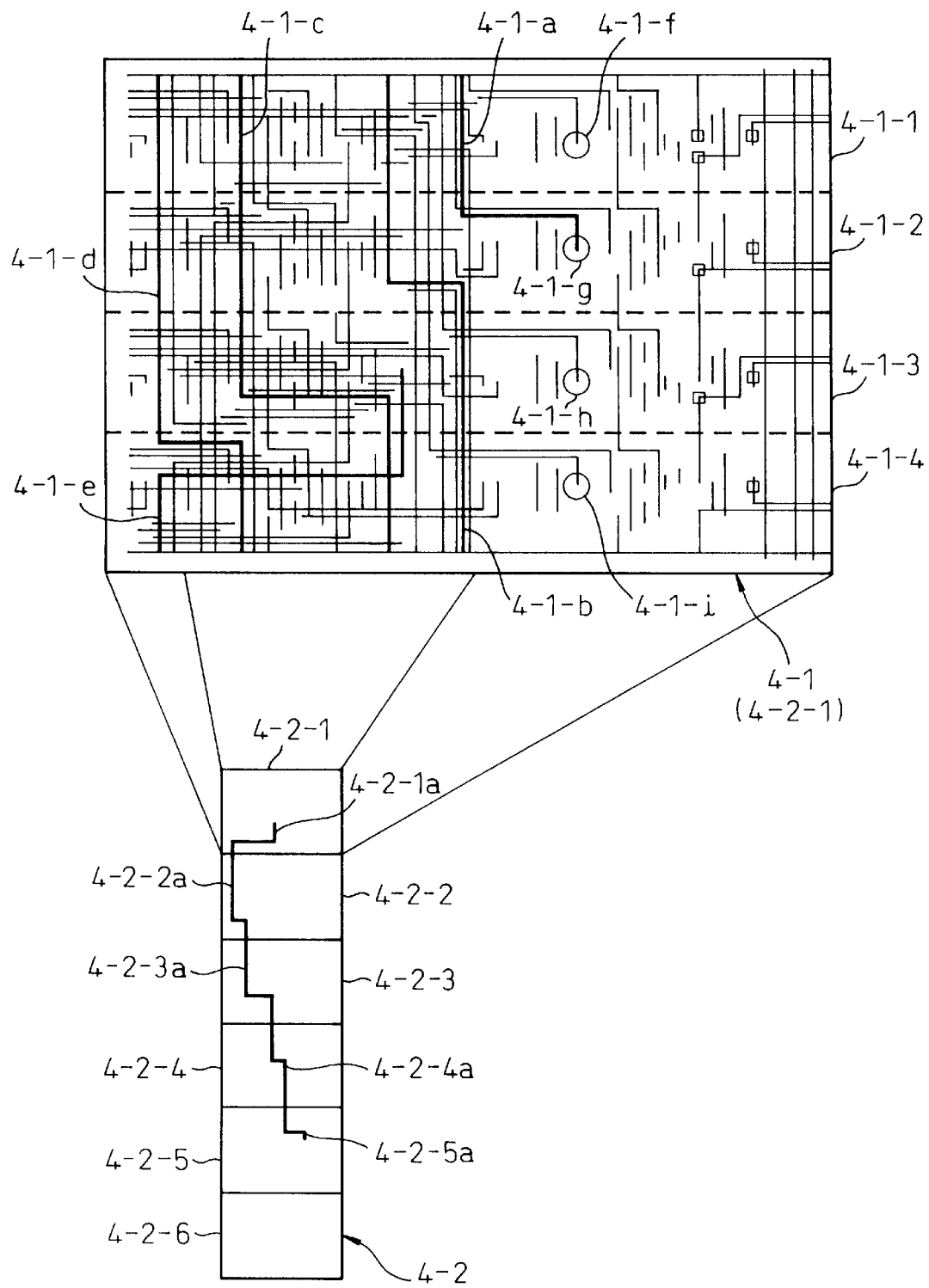
FIGS. 4A, 4B, and 4C are diagrams for explaining an applied example of the hierarchical routing method to be implemented in a layout system for a semiconductor integrated circuit in accordance with the present invention.
Figure 4B:
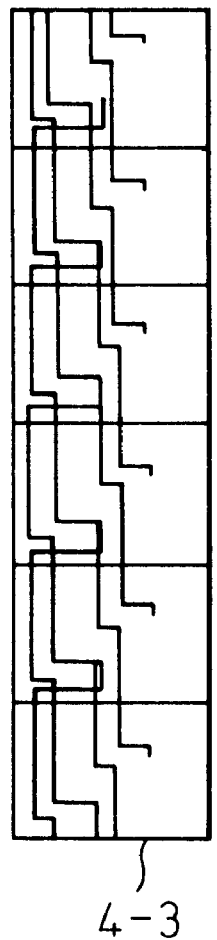
Figure 4C:
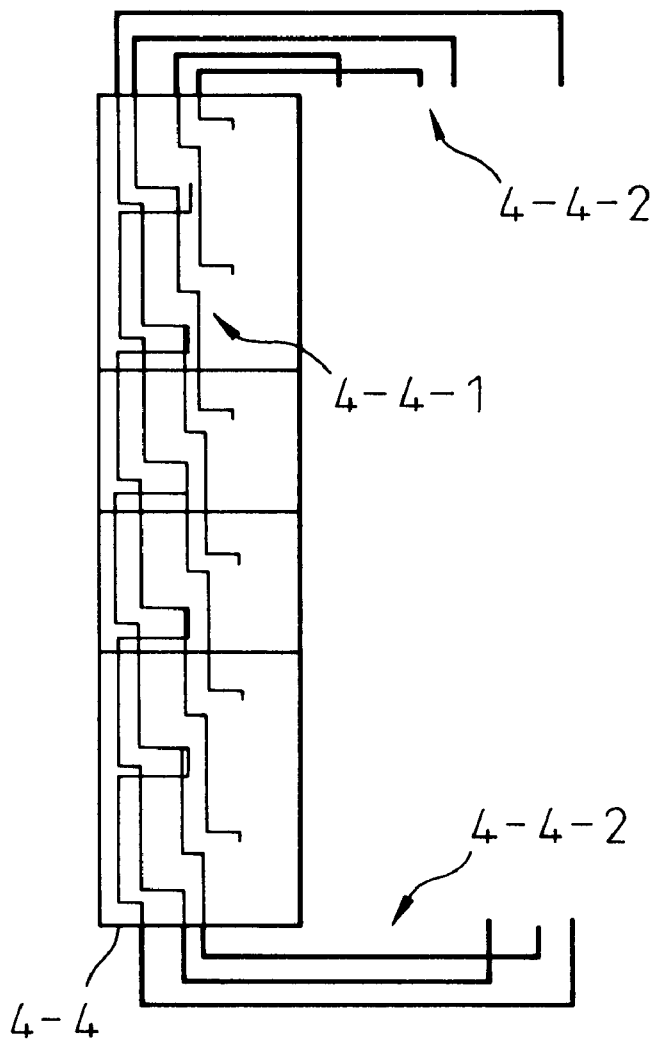

FIGS. 4A, 4B, and 4C are diagrams for explaining an applied example in which the hierarchical routing method to be implemented in a layout system for a semiconductor integrated circuit in accordance with the present invention is adapted to a multiplier.

As shown in FIG. 4A, a multiplier (part of a multiplier) 4-2 is composed of six unit circuits (first cells) 4-2-1 to 4-2-6. Each first cell 4-2-1 (4-1) is composed of four unit circuits (second cells) 4-1-1 to 4-1-4. That is to say, the multiplier 4-2 consists of 24 cells (second cells).

One carrier line for shifting 15 bits at a time in the multiplier 4-2 will be discussed. The line is made by linking line portions including a line 4-2-5a in the first cell 4-2-5 and a line 4-2-1a in the first cell 4-2-1. The line portion in one first cell 4-1 (4-2-1) consists of lines 4-1-a to 4-1-d. For the multiplier 4-2 shown in FIG. 4A, only one line is drawn. When six sets of the lines 4-1-a to 4-1-d in the first cell 4-1 are lined in tandem, a plurality of lines (11 lines) 4-3 are linked as shown in FIG. 4B.

As shown in FIG. 4A, in each of the second cells 4-1-1 to 4-1-4 (unit circuits constituting a repetitive circuit portion) constituting the first cell 4-1 (4-2-1), input ports 4-1-f to 4-1-i are included in the cells (for handling different bits). As shown in FIG. 4B, the lines 4-1-a to 4-1-d are linked to the input port 4-1-g in the associated cell (first cell). The same lines are produced for each of the other three input ports 4-1-f, 4-1-h, and 4-1-i in the first cell (4-1). In practice, similar carrier lines for shifting 15 bits at a time are provided at a density that is four times as high as the density shown in FIG. 4A.

The routing shown in FIGS. 4A and 4B corresponds to hierarchical layout 3-1 for producing a repetitive circuit portion which is described in the flowchart of FIG. 3. The illustrated wiring corresponds to the hierarchy data (1-2) representing a structure made by placing a cell (first cell and second cell) that is a unit of repetition used to construct the repetitive circuit portion repeatedly in the form of an array.

After the hierarchy data (1-2) is hierarchically expanded, information on wiring and nodes is extracted as mentioned above. The layout net list (3-2-4) containing the information on wiring and nodes is thus produced and compared with the logic net list (3-2-6) by the LVS unit (3-2-5).

When it is found as a result of the comparison performed by the LVS unit that the layout net list (3-2-4) and logic net list (3-2-6) are consistent with each other (3-2-5), initial wiring data (3-2-8) 4-4-1 in FIG. 4C produced by appending node information of logic nodes to expand data is produced. When it is found as a result of the comparison performed by the LVS unit that no connection has been made, the unconnected net list (3-2-9) is used to carry out automatic routing. Unconnected wiring data (3-2-10) 4-4-2 in FIG. 4C is then produced. The initial wiring data 4-4-1 and unconnected wiring data 4-4-2 are used to produce final layout data 4-4 (3-2-11).

The wiring data 4-4-1 (for example, signal lines linking multiplication units in the multiplier) concerning a repetitive circuit portion in FIG. 4C is produced manually by adapting hierarchical layout. By nullifying a difference in length or capacitance of a wiring among cells produced by performing automatic routing of placing the same cell repeatedly according to a known method, or by overcoming a difficulty in line connection, a repetitive circuit portion (data path) exhibiting excellent properties can be produced by laying out circuit elements. By carrying out automatic routing, signal lines for a clock and control signals or a random circuit (for example, signal lines linking a multiplication unit for handling the most or least significant bit in the multiplier and other peripheral circuits) 4-4-4-2 can be produced without an error in such a manner that the length of a wiring becomes the shortest.

As mentioned above, according to the hierarchical routing method to be implemented in a layout system for a semiconductor integrated circuit in accordance with the present invention, it becomes possible to allow both complex repetitive routing to be carried out manually and efficient random routing based on automatic routing for, for example, constructing a multiplier or the like. The man-hours required for expansion can be shortened and high performance achieved. For example, efficiency in the design of a repetitive circuit portion (data path) can be improved.

Figure 5:
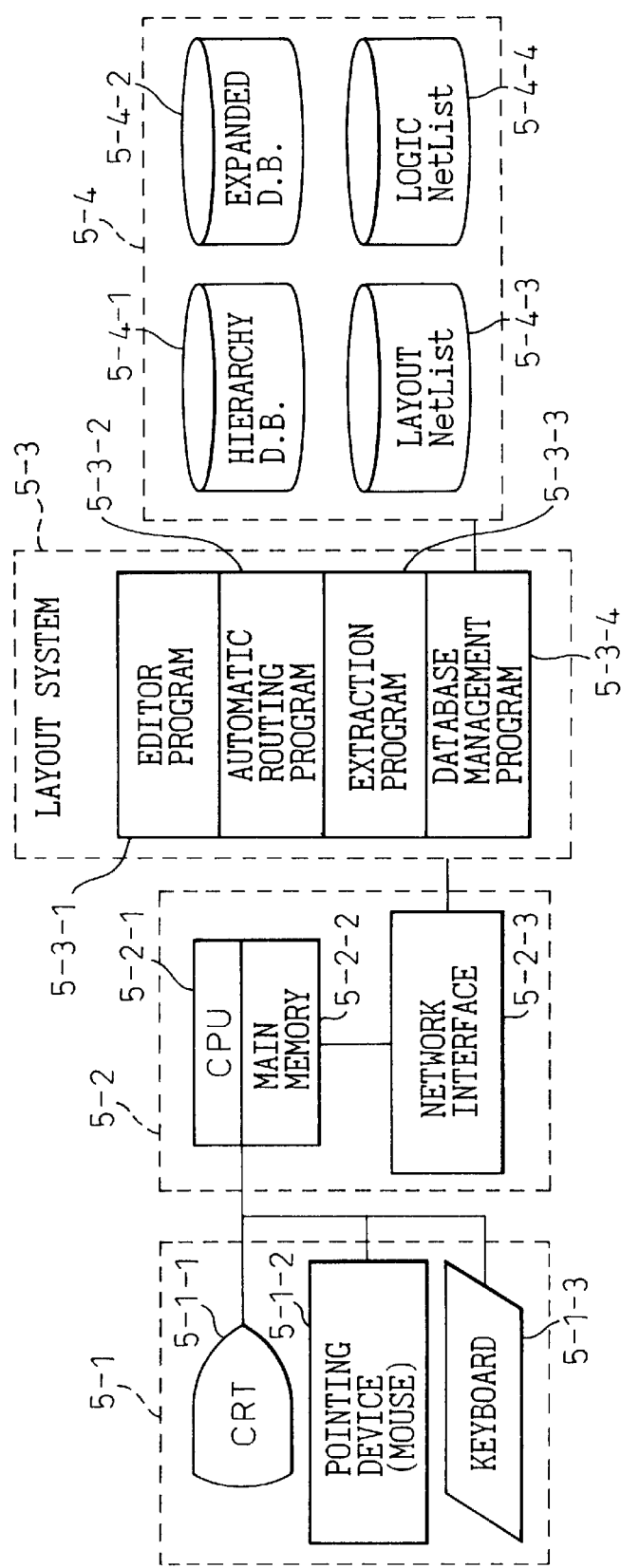
FIG. 5 is a block diagram schematically showing an example of the configuration of a layout system for a semiconductor integrated circuit in accordance with the present invention.

The aforesaid hierarchical routing method to be implemented in a layout system for a semiconductor integrated circuit in accordance with the present invention, that is, a hierarchical routing program to be installed in a layout system for a semiconductor integrated circuit in accordance with the present invention is run on the system shown in FIG. 5.

FIG. 5 is a block diagram schematically showing an example of the configuration of a layout system for a semiconductor integrated circuit in accordance with the present invention. In FIG. 5, there are shown a user interface 5-1, a main terminal unit 5-2, an application server 5-3, and a database server 5-4.

The user interface 5-1 is composed of a CRT 5-5-1 for providing a user (an operator) with image information, a pointing device 5-1-2 such as a mouse used to indicate any position on the CRT 5-5-1, and a keyboard 5-1-3 used to enter various commands and data. The main terminal unit 5-2 includes a CPU 5-2-1 for carrying out various kinds of processing, a main memory 5-2-2, and a network interface 5-2-3 for networking the main terminal unit and the application server 5-3.

In the application server 5-3, various programs to be run by the CPU 5-2-1 in the main terminal unit 5-2 for realizing the layout system are stored. Specifically, an editor program 5-3-1, an automatic routing program 5-3-2, an extraction program 5-3-3 for extracting information on wiring and nodes, and a database management program 5-3-4 are stored. In the database server 5-4, a hierarchy database 5-4-1 to be managed by the database management program 5-3-4, an expanded database 5-4-2, a layout net list 5-4-3, and a logic net list 5-4-4 are stored.

As for correspondence with the steps in the flowchart of FIG. 3, the editor program 5-3-1 is used at step 3-1-1 of laying out circuit elements to produce a unit of repetition or at step 3-1-2 of placing the unit of repetition repeatedly in the form of an array. The automatic routing program 5-3-2 is used to produce the unconnected wiring data 3-2-10 using the unconnected net list 3-2-9. The automatic routing program 5-3-2 may be used at step 3-1-1. Furthermore, the extraction program 5-3-3 is used at step 3-2-3 of producing the layout net list 3-2-4 (5-4-2) using the expanded database 3-2-2 (5-4-2).

The hierarchy database 5-4-1 in the database server 5-4 corresponds to the hierarchy database 3-1-3 in FIG. 3. The expanded database 5-4-2 therein corresponds to the expanded database 3-2-2 in FIG. 3. The layout net list 5-4-3 therein corresponds to the layout net list 3-2-4 in FIG. 3. The logic net list 5-4-4 therein corresponds to the logic net list 3-2-6 in FIG. 3.

FIG. 6 shows a model of a practical example of a medium on which the hierarchical routing program to be installed in a layout system for a semiconductor integrated circuit in accordance with the present invention is recorded (stored). In FIG. 6, there are shown a processing unit 6-1 (corresponding to the layout system for a semiconductor integrated circuit shown in FIG. 5), a program (data) provider 6-2 for providing a program over a transmission line, and a CD-ROM or floppy disk 6-3 serving as a portable storage medium. The processing unit 6-1 includes a computer 6-1-1, and a processing-unit memory 6-1-2 that is a memory (RAM or hard disk) in which a program (data) is stored. The program (data) provider 6-2 has a memory 6-2-1 (line-end memory) in which a program (data) can be stored.

The aforesaid hierarchical routing method to be implemented in a layout system for a semiconductor integrated circuit in accordance with the present invention is provided as a program to be run by the computer 6-1-1 in the form of a storage medium. More particularly, the storage medium includes, for example, as shown in FIG. 6, the line-end memory 6-2-1 from which the program is provided over a transmission line, the magnetic or optical portable storage medium 6-3 such as a CD-ROM, floppy disk, MO disk, or DVD-ROM, and the processing-unit memory incorporated in the processing unit 6-1. The program stored in these storage media is loaded and run on the main memory in the computer 6-1-1.

As described above, according to the present invention, a cell used to construct a repetitive circuit portion is designed by utilizing a hierarchical structure. Data is processed so that it can be handled by automatic routing. Thus, a data path that is conventionally designed manually in order to ensure excellent properties can be designed in a short period of time by exploiting the merit of automatic routing.

Many different embodiments of the present invention may be constructed without departing from the spirit and scope of the present invention, and it should be understood that the present invention is not limited to the specific embodiments described in this specification, except as defined in the appended claims.

What is claimed is:

1. A hierarchical routing method to be implemented in a layout system for a semiconductor integrated circuit having a repetitive circuit portion, comprising the steps of:

laying out circuit elements for said repetitive circuit portion with said repetitive circuit portion structured hierarchically;

expanding the hierarchically structured layout for said repetitive circuit portion in a separate independent database;

collating a layout net list and a logic net list concerning the expanded layout for said repetitive circuit portion, and producing an unconnected net list containing data that does not reside in said layout net list; and extracting information of connections from the expanded layout for said repetitive circuit portion so as to carry out routing.

2. A hierarchical routing method as claimed in claim 1, wherein said produced unconnected net list is used to carry out automatic routing.

3. A hierarchical routing method to be implemented in a layout system for a semiconductor integrated circuit having a repetitive circuit portion, comprising the steps of:

laying out circuit elements for said repetitive circuit portion with said repetitive circuit portion structured hierarchically;

expanding the hierarchically structured layout for said repetitive circuit portion in a separate independent database; and extracting information of connections from the expanded layout for said repetitive circuit portion so as to carry out routing, wherein version management is carried out in order to keep a hierarchy database and an expanded database mutually consistent, said hierarchy database representing a hierarchical structure of said repetitive circuit portion, said expanded database being an expansion of the hierarchy database.

4. A hierarchical routing method to be implemented in a layout system for a semiconductor integrated circuit having a repetitive circuit portion, comprising the steps of:

laying out circuit elements for said repetitive circuit portion with said repetitive circuit portion structured hierarchically;

expanding the hierarchically structured layout for said repetitive circuit portion in a separate independent database, the layout of circuit elements for a unit of repetition used to construct said repetitive circuit portion being carried out by an automatic routing; and extracting information of connections from the expanded layout for said repetitive circuit portion so as to carry out routing.

5. A hierarchical routing method to be implemented in a layout system for a semiconductor integrated circuit having a repetitive circuit portion, comprising the steps of:

manually or automatically laying out circuit elements for a cell that is a unit of repetition used to construct said repetitive circuit portion;

producing a hierarchy database by manually placing said cell repeatedly;

producing an expanded database by expanding said hierarchy database in another database;

comparing a layout net list produced by using said expanded database with a logic net list; identifying initial data that is data commonly contained in said layout net list and said logic net list;

producing an unconnected net list by extracting data, which is not contained in said layout net list, from said logic net list, and carrying out automatic routing using said unconnected net list so as to produce unconnected wiring data; and producing final layout data using said initial data and unconnected wiring data.

6. A hierarchical routing method as claimed in claim 5, wherein version management is carried out in order to keep said hierarchy database and said expanded database mutually consistent.

7. A medium on which a hierarchical routing program to be run under a computer system is stored in order to implement a hierarchical routing method to be implemented in a layout system for a semiconductor integrated circuit having a repetitive circuit portion, wherein the hierarchical routing method comprises the steps of:

manually or automatically laying out circuit elements for a cell that is a unit of repetition used to construct said repetitive circuit portion;

producing a hierarchy database by manually placing said cell repeatedly;

producing an expanded database by expanding said hierarchy database in another database;

comparing a layout net list produced by using said expanded database with a logic net list;

identifying initial data that is data commonly contained in said layout net list and said logic net list;

producing an unconnected net list by extracting data, which is not contained in said layout net list, from said logic net list, and carrying out automatic routing using said unconnected net list so as to produce unconnected wiring data; and producing final layout data using said initial data and unconnected wiring data.

8. A medium as claimed in claim 7, wherein version management is carried out in order to keep said hierarchy database and said expanded database mutually consistent.

9. A medium on which a hierarchical routing program to be run under a computer system is stored in order to implement a hierarchical routing method to be implemented in a layout system for a semiconductor integrated circuit having a repetitive circuit portion, wherein the hierarchical routing method comprises the steps of:

laying out circuit elements for said repetitive circuit portion with said repetitive circuit portion structured hierarchically;

expanding the hierarchically structured layout for said repetitive circuit portion in a separate independent database;

collating a layout net list and a logic net list concerning the expanded layout for said repetitive circuit portion, and producing an unconnected net list containing data that does not reside in said layout net list; and extracting information of connections from the expanded layout for said repetitive circuit portion so as to carry out routing.

10. A medium as claimed in claim 9, wherein said produced unconnected net list is used to carry out automatic routing.

11. A medium on which a hierarchical routing program to be run under a computer system is stored in order to implement a hierarchical routing method to be implemented in a layout system for a semiconductor integrated circuit having a repetitive circuit portion, wherein the hierarchical routing method comprises the steps of:

laying out circuit elements for said repetitive circuit portion with said repetitive circuit portion structures hierarchically;

expanding the hierarchically structured layout for said repetitive circuit portion in a separate independent database; and extracting information of connections from the expanded layout for said repetitive circuit portion so as to carry out routing, wherein version management is carried out in order to keep a hierarchy database and an expanded database mutually consistent, said hierarchy database representing a hierarchical structure of said repetitive circuit portion, said expanded database being an expansion of the hierarchy database.

12. A medium on which a hierarchical routing program to be run under a computer system is stored in order to implement a hierarchical routing method to be implemented in a layout system for a semiconductor integrated circuit having a repetitive circuit portion, wherein the hierarchical routing method comprises the steps of:

laying out circuit elements for said repetitive circuit portion with said repetitive circuit portion structured hierarchically;

expanding the hierarchically structured layout for said repetitive circuit portion in a separate independent database, the layout of circuit elements for a unit of repetition used to construct said repetitive circuit portion being carried out by an automatic routing; and extracting information of connections from the expanded layout for said repetitive circuit portion so as to carry out routing.

\* \* \* \* \*